(12) United States Patent
Ichikawa et al.

(10) Patent No.: US 8,023,806 B2
(45) Date of Patent: Sep. 20, 2011

(54) HEAT PROCESSING FURNACE AND VERTICAL-TYPE HEAT PROCESSING APPARATUS

(75) Inventors: Takashi Ichikawa, Nirasaki (JP); Makoto Kobayashi, Nirasaki (JP); Kenichi Yamaga, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 822 days.

(21) Appl. No.: 12/076,531

(22) Filed: Mar. 19, 2008

(65) Prior Publication Data
US 2008/0232787 A1    Sep. 25, 2008

(30) Foreign Application Priority Data

Mar. 20, 2007   (JP) .................................. 2007-072477
Feb. 5, 2008    (JP) .................................. 2008-025113

(51) Int. Cl.
*A21B 2/00* (2006.01)
(52) U.S. Cl. ......................................... 392/416; 392/407
(58) Field of Classification Search .................. None
See application file for complete search history.

(56) References Cited

U.S. PATENT DOCUMENTS

| | | | | |
|---|---|---|---|---|
| 4,849,608 A * | 7/1989 | Muraoka et al. | ............. | 219/390 |
| 5,128,515 A * | 7/1992 | Tanaka | ............. | 219/390 |
| 5,171,972 A * | 12/1992 | Hidano | ............. | 219/390 |
| 5,187,771 A * | 2/1993 | Uchida | ............. | 392/416 |
| 5,506,389 A * | 4/1996 | Hidano et al. | ............. | 219/390 |
| 6,005,225 A * | 12/1999 | Kowalski et al. | ............. | 219/390 |
| 6,125,134 A * | 9/2000 | Jonsson et al. | ............. | 373/128 |
| 7,595,465 B2 * | 9/2009 | Kolk | ............. | 219/402 |
| 2007/0148607 A1 * | 6/2007 | Tani | ............. | 432/241 |
| 2008/0073334 A1 * | 3/2008 | Nakao et al. | ............. | 219/385 |
| 2008/0086228 A1 * | 4/2008 | Yamaji et al. | ............. | 700/109 |
| 2008/0205864 A1 * | 8/2008 | Kobayashi et al. | ............. | 392/416 |
| 2008/0296282 A1 * | 12/2008 | Kobayashi et al. | ............. | 219/385 |

FOREIGN PATENT DOCUMENTS

| | | |
|---|---|---|
| JP | 10-233277 | 9/1998 |
| JP | 2005-197074 | 7/2005 |

OTHER PUBLICATIONS

Chinese Office Action issued on Aug. 4, 2010 for Chinese Application No. 200810100377.9 w/English translation.

* cited by examiner

*Primary Examiner* — Thor Campbell
(74) *Attorney, Agent, or Firm* — Smith, Gambrell & Russell, LLP

(57) ABSTRACT

There is provided a heat processing furnace capable of quickly increasing and decreasing a temperature, while achieving improvement in durability. A heat processing furnace 2 comprises: a processing vessel 3 for accommodating an object to be processed w and performing thereto a heat process; and a cylindrical heater 5 disposed to surround an outer circumference of the processing vessel 3, for heating the object to be processed w. The heater 5 includes a cylindrical heat insulating member 16, and heating resistors 18 arranged along an inner circumferential surface of the heat insulating member 16. Each of the heating resistors 18 is formed of a strip-shaped member that is bent into a waveform having peak portions and trough portions. Pin members 20 are arranged in the heat insulating member 16 at suitable intervals therebetween, the pin members 20 holding the heating resistor 18 such that the heating resistor 18 is movable in a radial direction of the heater.

18 Claims, 10 Drawing Sheets

HEAT PROCESSING FURNACE AND VERTICAL-TYPE HEAT PROCESSING APPARATUS

CROSS REFERENCE TO RELATED APPLICATIONS

This application is based upon and claims the benefit of priority from the prior Japanese Patent Application No. 2007-72477 filed on Mar. 20, 2007, and Japanese Patent Application No. 2008-25113 filed on Feb. 5, 2008, the entire contents of which are incorporated herein by reference.

TECHNICAL FIELD

The present invention relates to a heat processing furnace and a vertical-type heat processing apparatus including the heat processing furnace.

BACKGROUND ART

When a semiconductor device is manufactured, various heat processing apparatuses are used for subjecting a semiconductor wafer, which is an object to be processed, to processes such as an oxidation process, a diffusion process, and a CVD (Chemical Vapor Deposition) process. A general heat processing apparatus includes a heat processing furnace which is composed of: a processing vessel (reaction tube) capable of accommodating semiconductor wafers and heat-processing the same; and a heater (heating device) that is disposed to cover a circumference of the processing vessel, for heating wafers in the processing vessel. The heater has a cylindrical heat insulating member, and a heating resistor disposed on an inner circumferential surface of the heat insulating member via a supporting member.

In a heat processing apparatus capable of performing a batch process, for example, there is used, as the heating resistor, a helical heating element (also referred to as "heating wire" and "heating resistor") arranged along an inner wall surface of the cylindrical heat insulating member. The heating element can heat an inside of the furnace to a high temperature such as about 800° C. to 1000° C. As the heat insulating member, there is used a member that is formed by burning a heat insulating material, such as ceramic fibers, into a cylindrical shape. The heat insulating member can reduce a heat quantity lost as radiant heat and conductive heat, so as to enhance efficiency in heating. As the supporting member, there is used a ceramic member, for example. The ceramic supporting member can support the heating element at predetermined pitches, while allowing heat expansion and heat shrinkage of the heating element.

In the above heat furnace, in order that the heating element can be thermally expanded and thermally shrunk, the heating element, which is helically formed, is supported such that a clearance is defined between the heating element and the heat insulating member. However, by using the heating element under a high temperature, the heating element undergoes a creep strain, and slowly increases in length over time. In addition, the heating element is thermally expanded during a heating operation. On the other hand, there is an apparatus that quickly cools the heating element by blowing air thereto so as to decrease a temperature. Due to the repeated rise and drop in temperature, the heating element is likely to be deformed. This may generate a short-circuit between adjacent parts of the deformed heating element, which may invite disconnection.

Particularly in a vertical-type heat processing furnace, the heating element is moved in the supporting member because of the repeated heat expansion and heat shrinkage caused by the rise and drop in temperature, and the heating element is moved downward little by little because of gravitation. Then, the moving amount is accumulated at a lowermost turn of the heating element. Namely, because of the accumulation of the movement of the heating element, a winding diameter of the lowermost turn is increased. When the heating element of the increased winding diameter reaches an inner surface of the heat insulating member and cannot be expanded outside any more, the heating element is then deformed in the up and down direction. Thus, there is a possibility that a short-circuit occurs between a part and another part adjacent thereto of the heating element, resulting in some disconnection.

In order to solve these problems, the following structure has been proposed. Namely, with a view to preventing such an accumulation to one side of the elongated heating element caused by creep and thermal expansion or the like, a fixing member of a rod-like shape is attached to an outside portion of the heating element by welding, and a distal end of the fixing member is buried to be fixed in a heat insulating member, so that the fixing member projects outward in a radial direction of the furnace (see, Patent Document 1).

[Patent Document 1] JP10-233277A
[Patent Document 2] JP2005-197074A

However, in the above structure in which the fixing member is merely joined to the outside portion of the heating element by welding, the joined portion is exposed to a high temperature. In addition, it can be considered that a stress tends to concentrate on the joined portion when the heating resistor is thermally expanded or thermally shrunk, which entails deterioration in durability (reduction in lifetime) of the heating element. Further, since the fixing member has a bar-like shape, the fixing member may easily drop out of the heat insulating member, whereby it is difficult to secure a sufficient holding force for the fixing member.

Moreover, when it is desired to quickly increase or decrease the temperature of a wafer, a large power has to be applied to a heating element during the quick temperature-increasing operation. However, a conventional, general heating element may not withstand the large load, and may be prone to be disconnected. For this reason, such a large power cannot be actually applied, and thus the quick temperature increase/decrease operation has been limited. Although the use of a heating element resistant to disconnection can overcome the difficulty, this incurs increase in cost because such a heating element is expensive.

Meanwhile, in order to make longer the lifetime (to improve the durability) of the heating element by reducing a load applied thereto, it is effective to increase a ratio of a surface area of the heating element (element surface area) relative to a supplied power. This is because, when the heating element surface area is increased, a surface temperature of the heating element is lowered, to thereby reduce a load of the heating element. Since a so-called spiral (helical)-type heating element can be efficiently arranged in a desired space, such a design is used for load reduction. However, as shown in FIG. 14, for example, a heater or a heat processing furnace using a spiral-type heating element conventionally employs a structure in which a heating element 18 is buried in a heat insulating member 16 so as to fix therein the heating element 18. Thus, an object to be heated in a reactor core is heated via the heat insulating member 16, so that it is difficult to quickly increase a temperature of the object. It is also difficult to quickly decrease the temperature of the object, because the heating element 18 is cooled via the heat insulating member 16, in addition to an effect of increase in heat capacity caused by the heat insulating member 16. Moreover, since there is no clearance for allowing expansion of the heating element 18, the heating element 18 itself is stressed when it is expanded. Thus, durability of the heating element may be not sufficient.

There is known a heating element that is manufactured by forming a strip-shaped heating resistance member into a waveform (Patent Document 2). Similarly to the spiral-type heating element, although this type of heating element can have an increased surface area, but has the same disadvantage in terms of installation thereof in a cylindrical insulating member.

DISCLOSURE OF THE INVENTION

The present invention has been made under the above circumstances. The object of the present invention is to provide a heat processing furnace and a vertical-type heat processing apparatus that are capable of quickly increasing and decreasing a temperature, while achieving improvement in durability and reduction in cost.

The present invention is a heat processing furnace comprising: a processing vessel for accommodating an object to be processed and performing thereto a heat process; and a cylindrical heater disposed to surround an outer circumference of the processing vessel, for heating the object to be processed; wherein the heater includes a cylindrical heat insulating member, and heating resistors arranged along an inner circumferential surface of the heat insulating member, each of the heating resistors is formed of a strip-shaped member that is bent into a waveform having peak portions and trough portions, and pin members are arranged in the heat insulating member at suitable intervals therebetween, the pin members holding the heating resistor such that the heating resistor is movable in a radial direction of the heater.

The present invention is the heat processing furnace, wherein each of the pin members is formed into a U-shape having a pair of leg portions for supporting the trough portion of the heating resistor, the respective leg portions pass through the heat insulating member from inside to outside, and the respective leg portions are bent on the outside to be locked on an outer circumferential surface of the heat insulating member.

The present invention is the heat processing furnace, wherein a plurality of circumferentially continuous groove sections are vertically formed at suitable intervals therebetween in the inner circumferential surface of the heat insulating member, and all or a part of the heating resistors are received in the groove sections.

The present invention is the heat processing furnace, wherein a plurality of forcible-cooling-air blowing holes are circumferentially formed at suitable intervals therebetween in the heat insulating member to pass therethrough from inside to outside at a position between the vertically adjacent heating resistors.

The present invention is the heat processing furnace, wherein the heat insulating member is divided into a right half part and a left half part, with longitudinally extending dividing surfaces therebetween, each of the heating resistors is also divided into a right half part and a left half part, corresponding to the heat insulating member, one heating resistor and the other heating resistors vertically adjacent thereto are connected to each other at their ends via connecting plates, and the connecting plates are disposed on the dividing surface parts of the heat insulating member.

The present invention is the heat processing furnace, wherein each of the connecting plates is fixed on the dividing surface part by means of a fixing member formed of a pin.

The present invention is the heat processing furnace, wherein each of the connecting plates is provided with a locking portion to be locked on an outer circumferential surface of the heat insulating member.

The present invention is the heat processing furnace, wherein each of the connecting plates is provided with a fixing piece that is pushed into the heat insulating member to be fixed therein.

The present invention is the heat processing furnace, wherein each of the connecting plates is provided with a falling-down prevention pin that holds the peak portion of the heating resistor.

The present invention is the heat processing surface, wherein the heat insulating member is provided with a falling-down prevention plate that supports a lower part of the peak portion of the heating resistor so as to prevent fallingdown of thereof.

The present invention is a vertical-type heat processing apparatus comprising: a heat processing furnace including: an elongated processing vessel for accommodating an object to be processed and performing thereto a heat process, with a lower end of the processing vessel being opened to define a furnace opening; and a cylindrical heater disposed to surround an outer circumference of the processing vessel, for heating the object to be processed; a lid member for closing the furnace opening; a holder placed on the lid member, the holder holding a plurality of objects to be processed in tierlike manner; and an elevating mechanism that elevates and lowers the lid member to open and close the same, and loads and unloads the holder into and from the processing vessel; wherein the heater includes a cylindrical heat insulating member, and heating resistors arranged along an inner circumferential surface of the heat insulating member, each of the heating resistors is formed of a strip-shaped member that is bent into a waveform having peak portions and trough portions, and pin members are arranged in the heat insulating member at suitable intervals therebetween, the pin members holding the heating resistor such that the heating resistor is movable in a radial direction of the heater.

The present invention is the vertical-type heat processing apparatus, wherein each of the pin members is formed into a U-shape having a pair of leg portions for supporting the trough portion of the heating resistor, the respective leg portions pass through the heat insulating member from inside to outside, and the respective leg portions are bent on the outside to be locked on an outer circumferential surface of the heat insulating member.

The present invention is the vertical-type heat processing apparatus, wherein a plurality of circumferentially continuous groove sections are vertically formed at suitable intervals therebetween in the inner circumferential surface of the heat insulating member, and all or a part of the heating resistors are received in the groove sections.

The present invention is the vertical-type heat processing apparatus, wherein a plurality of forcible-cooling-air blowing holes are circumferentially formed at suitable intervals therebetween in the heat insulating member to pass therethrough from inside to outside at a position between the vertically adjacent heating resistors.

The present invention is the vertical-type heat processing apparatus, wherein the heat insulating member is divided into a right half part and a left half part, with longitudinally extending dividing surfaces therebetween, each of the heating resistors is also divided into a right half part and a left half part, corresponding to the heat insulating member, one heating resistor and the other heating resistors vertically adjacent thereto are connected to each other at their ends via connecting plates, and the connecting plates are disposed on the dividing surface parts of the heat insulating member.

The present invention is the vertical-type heat processing apparatus, wherein each of the connecting plates is fixed on the dividing surface part by means of a fixing member formed of a pin.

The present invention is the vertical-type heat processing apparatus, wherein each of the connecting plates is provided with a locking portion to be locked on an outer circumferential surface of the heat insulating member.

The present invention is the vertical-type heat processing apparatus, wherein each of the connecting plates is provided with a fixing piece that is pushed into the heat insulating member to be fixed therein.

The present invention is the vertical-type heat processing apparatus, wherein each of the connecting plates is provided with a falling-down prevention pin that holds the peak portion of the heating resistor.

The present invention is the vertical-type heat processing apparatus, wherein the heat insulating member is provided with a falling-down prevention plate that supports a lower part of the peak portion of the heating resistor so as to prevent falling-down of thereof.

According to the present invention, the heating resistor, which is manufactured by forming a strip-shaped heating resistor into a waveform, is placed in an exposed manner along the inner circumferential surface of the heat insulating member. Thus, a temperature can be quickly increased and decreased, and improvement in durability and reduction in cost can be achieved.

BEST MODE FOR CARRYING OUT THE INVENTION

Figure 1:
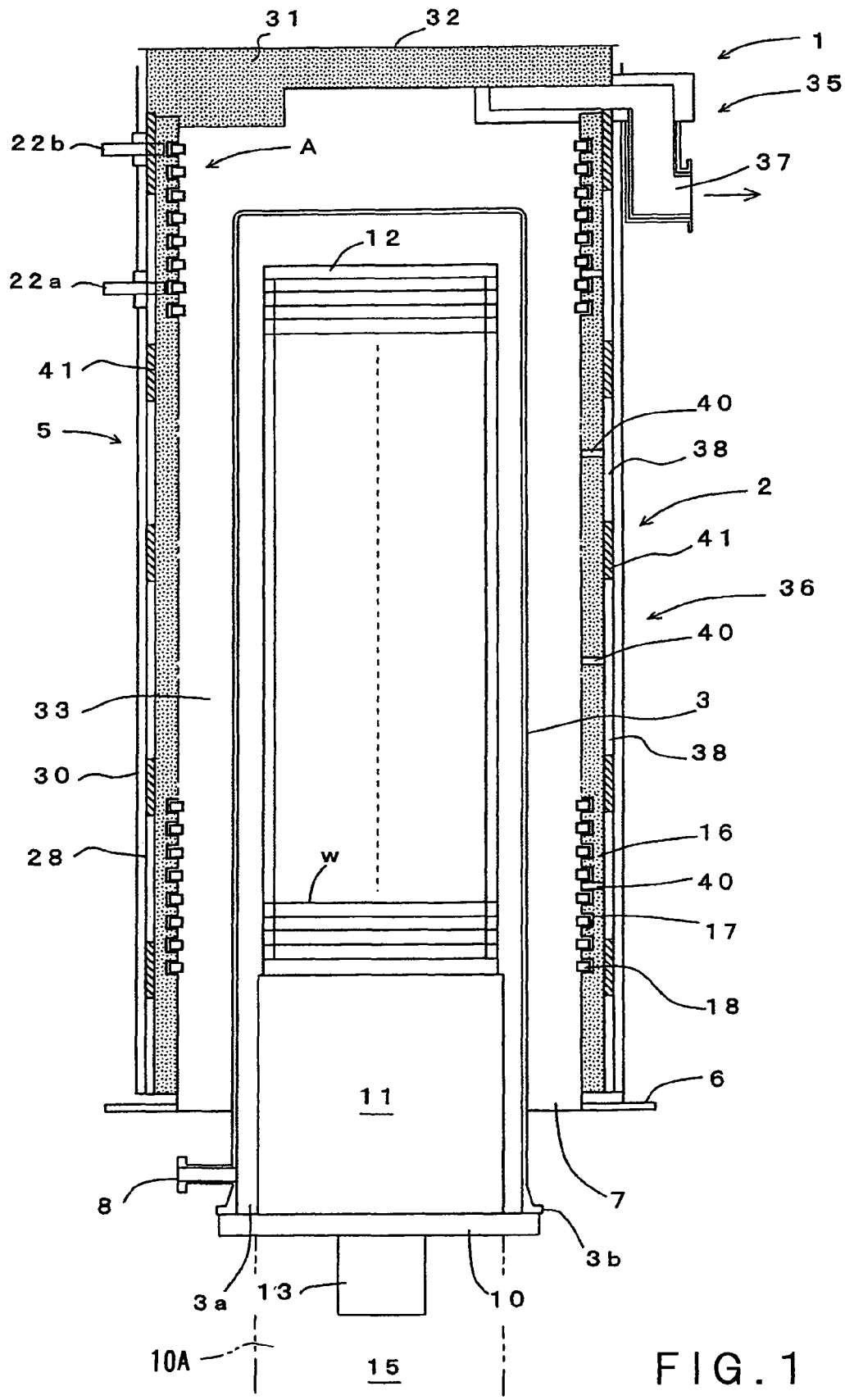
FIG. 1 is a longitudinal sectional view schematically showing an embodiment of a vertical-type heat processing apparatus of the present invention.
Figure 2:
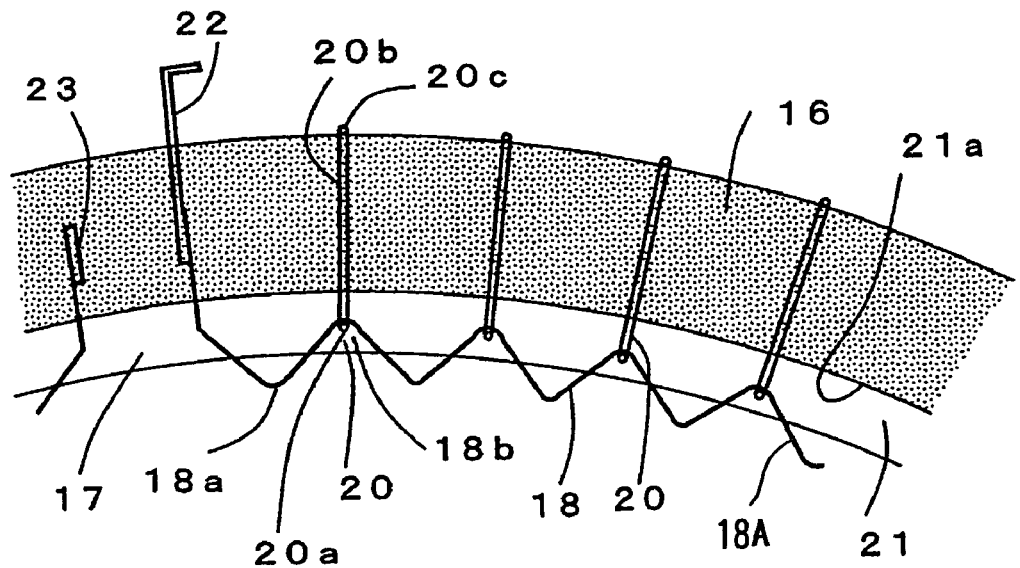
FIG. 2 is an enlarged cross-sectional view of a part A in FIG. 1.
Figure 3:
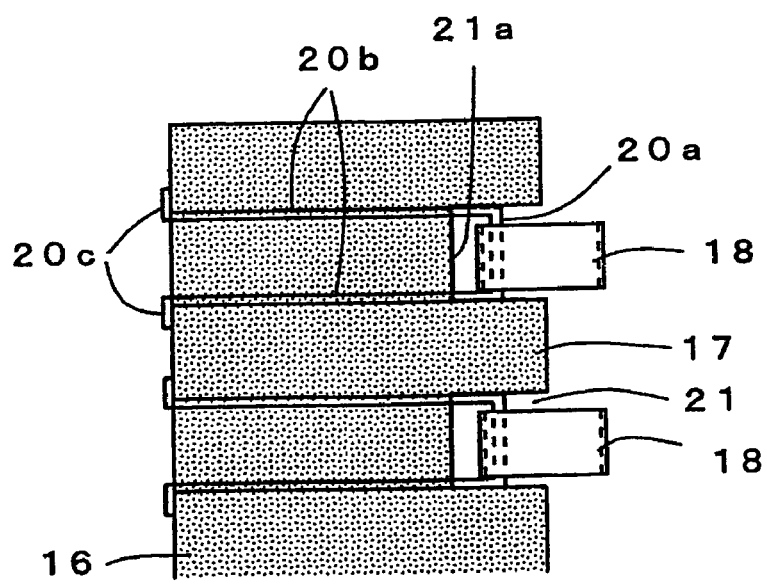
FIG. 3 is an enlarged longitudinal sectional view of the part A in FIG. 1.
Figure 4:
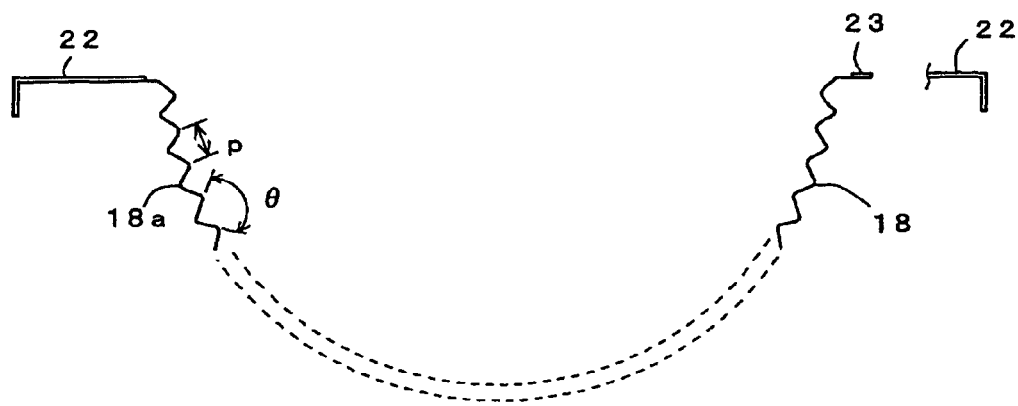
FIG. 4 is a plan view of a heating element.
Figure 5:
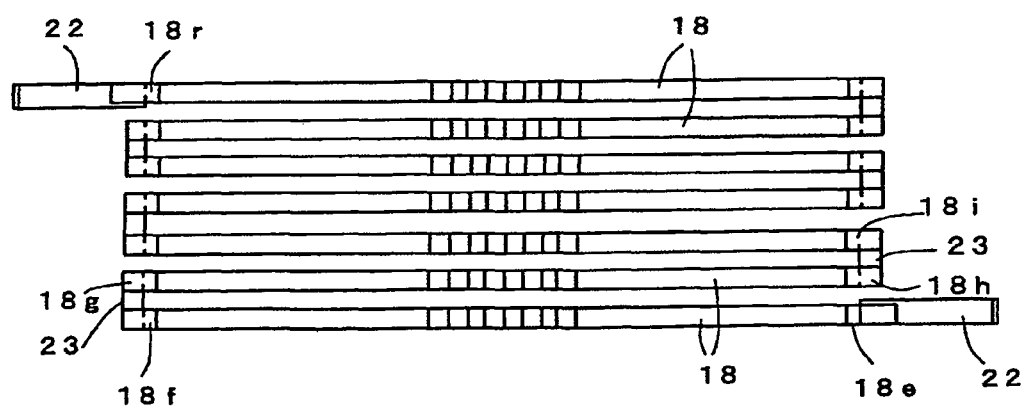
FIG. 5 is a side view of the heating element.

The best mode for carrying out the present invention will be described in detail with reference to the attached drawings. FIG. 1 is a longitudinal sectional view schematically showing an embodiment of a vertical-type heat processing apparatus of the present invention. FIG. 2 is an enlarged cross-sectional view of a part A in FIG. 1. FIG. 3 is an enlarged longitudinal view of the part A. FIG. 4 is a plan view of a heating element. FIG. 5 is a side view of the heating element.

FIG. 1 shows a vertical-type heat processing apparatus 1 which is a kind of a semiconductor manufacturing apparatus. The heat processing apparatus 1 includes a vertical-type heat processing furnace 2 that can simultaneously accommodate a number of objects to be processed such as semiconductor wafers w, and can perform thereto a heat process such as an oxidation process, a diffusion process, and a reduced-pressure CVD process. The heat processing furnace 2 includes: a processing vessel (also referred to as "reaction tube") 3 for accommodating wafers w and performing thereto a heat process; and a cylindrical heater (heating device) 5 disposed to surround an outer circumference of the processing vessel 3, for heating the wafers w.

The heat processing apparatus 1 also includes a base plate 6 on which the heater 5 is installed. The base plate 6 is provided with an opening 7 through which the processing vessel 3 is inserted upward from below. The opening 7 is equipped with a heat insulating member, not shown, which blocks a gap between the base plate 6 and the processing vessel 3.

The processing vessel 3 is made of quartz, and has an elongated cylindrical shape. An upper end of the processing vessel 3 is closed, while a lower end thereof is opened to define a furnace opening 3a. An outward flange 3b is formed around the opened end of the processing vessel 3. The flange 3b is supported by the base plate 6 through a flange pressing member, not shown. The illustrated processing vessel 3 is equipped with, in a lower part thereof, an introduction port (inlet) 8 for introducing a process gas and/or an inert gas into the processing vessel 3, and a discharge port (outlet), not shown, for discharging a gas in the processing vessel 3. A gas supply source is connected to the introduction port 8. Connected to the discharge port is an exhaust system having a vacuum pump capable of controlling a pressure in the processing vessel 3 to be reduced to, e.g., 10 Torr to $10^{-8}$ Torr.

Below the processing vessel 3, there is disposed a lid member 10 for closing the lower end opening (furnace opening) 3a of the processing vessel 3. The lid member 10 can be vertically moved by an elevating mechanism 10A. Disposed on an upper part of the lid member 10 is heat retaining means for the furnace opening, such as a heat retaining tube 11. Disposed on an upper part of the heat retaining tube 11 is a quartz boat 12 acting as a holder which is capable of holding a number of, e.g., about 100 to 150 wafers w having a diameter of, e.g., 300 mm, at predetermined vertical intervals therebetween. The lid member 10 is connected with a rotating mechanism 13 that rotates the boat 12 about its shaft center. The boat 12 is unloaded from the processing vessel 3 to a lower loading area 15, by the downward movement of the lid member 10. After replacement of wafers w, the boat 12 is loaded into the processing vessel 3, by the upward movement of the lid member 10.

As shown in FIGS. 2 to 5, the heater 5 includes: a cylindrical heat insulating member 16; a plurality of groove-like shelf sections 17 that are axially (vertically in the drawings) formed in a tier-like manner on an inner circumferential surface of the heat insulating member 16; and heating elements (heating wires, heating resistors) 18 that are placed along the respective shelf sections 17. The heat insulating member is made of inorganic fibers containing silica, alumina, or aluminum silicate, for example. In view of installation of the heating elements and assemblage of the heater, it is preferable that the heat insulating member is divided into a right half part and a left half part, with longitudinally extending dividing surfaces 16a therebetween.

The heating element 18 is made of a strip-shaped member 18A that is formed (bent) to have a waveform. The heating element 18 of a corrugated (waveform) type is made of an alloy (so-called kanthal material) containing, for example, iron (Fe), chrome (Cr), and aluminium (Al). The heating element 18 is about 1 mm to 2 mm in thickness, and about 14 mm to 18 mm in width. An amplitude of the waveform is about 11 mm to 15 mm, and a pitch p thereof is about 28 to 32 mm. An apex angle θ of the waveform of the heating element 18 is about 90 degrees. Apex point portions (also referred to as "protruding portions" or "peak portions") 18a are subjected to an R-bending process. This allows some circumferential movement of the heating element 18 on the shelf section 17 of the heat insulating member 16, and enhances strength in the bent portion.

Pin members are arranged in the heat insulating member 16 at suitable intervals therebetween. The pin members 20 hold the heating elements 18 such that the heating elements 18 are radially movable, while falling-out or coming-off of the heating elements 18 from the shelf sections 17 are prevented. The cylindrical heat insulating member 16 is provided with, in an inner circumferential surface thereof, a plurality of groove sections 21 which are formed at predetermined axial pitches therebetween to be concentric with the heat insulating member 16, so that the circumferentially continuous, annular shelf section 17 is formed between the upper groove section 21 and the lower groove section 21 adjacent thereto. Clearances are formed above and below the heating element 18 in the groove section 21, and another clearance is formed between a rear wall 21a of the groove section 21 and the heating element 18. These clearances are sufficient enough to allow thermal expansion, thermal shrinkage, and radial movement of the heating element 18. In addition, owing to these clearances, a cooling air, which is supplied during a forced air-cooling operation, can reach and pass through a rear side of the heating element 18, whereby the heating element 18 can be effectively cooled.

The pin member 20 includes a proximal portion 20a for supporting a trough portion 18b on the side of an inner circumferential surface of the heating element 18, and a pair of leg portions 20b passing through the heat insulating material 16 from inside to outside. The pin member 20 is formed to have substantially a U-shape in side view. End portions 20c of the pair of leg portions 20b are bent in opposite directions, so as to be locked on an outer circumferential surface of the heat insulating member 16. The pin member 20 is preferably made of the same material as that of the heating element 18. As shown in FIG. 3, it is preferable that the heating element 18 is accommodated in each groove section 21 such that a radially outside half part of the heating element 18 is received in the groove section 21, while a radially inside half thereof is exposed outside the groove section 21.

As shown in FIGS. 2 and 3, different from a conventional heating element which helically and vertically extends in a continuous manner, the heating element 18, which is placed on each shelf section 17 serving as a step, is terminated at each step. Thus, it can be prevented that the heating element 18 is moved downward by its own weight and piled up. Further, as shown in FIG. 5, the heating elements 18 are united (connected) between the adjacent upper and lower steps, and are serially connected among every plural steps (seven steps in the drawing). Furthermore, terminal plates 22 to be connected to electrodes are connected to a start end 18e of the lowermost step and a dead end 18r of the upper most step, for each group including the plural steps. Thus, the heater 5 is vertically divided into a plurality of zones in the heat processing furnace 2, whereby a temperature of each zone can be independently controlled.

Although the heating element 18 may be annularly positioned along the shelf section 17 or groove section 21 of the heat insulating member 16, it is preferable, as shown in FIG. 4, for easily assembling the heating element 18, the heating element 18 is formed into a halved shape (semi-circular shape) corresponding to the heat insulating member 16 which is divided into two along the dividing surfaces 16a. FIGS. 4 and 5 show, by way of example, a possible connection (wire connection) pattern of the heating elements 18. In this connection pattern, opposed ends 18e, 18f, 18g, . . . , and 18r of the heating elements 18 at the respective steps are bent to project radially outward, and the terminal plates 22 and 22 are respectively joined to the start end (right end) 18e of the first step (lowermost step) and the dead end (left end) 18r of the uppermost step. In addition, in order to serially connect the heating resistors 18 that are vertically adjacent to each other, the ends of the adjacent heating resistors 18 are sequentially connected to each other via connecting plate 23. Namely, the dead end 18f of the first step and the start end 18g of the second step are connected to each other via the connecting plate 23, and the dead end 18h of the second step and the start end 18i of the third step are connected to each other via another connecting plate 23. The connecting plates 23 are positioned on the dividing surfaces 16a of the heat insulating member 16.

The end of the heating element 18 and the connecting plate 23 are connected to each other by welding. The terminal plate 22 is located to radially pass through the insulating member 16. In order to prevent a welded portion between the connecting plate 23 and the end of the heating element 18 from being subjected to a high temperature, the connecting plate 23 is preferably buried in the heat insulating member 16. Other connecting patterns of the heating elements 18 are possible, in addition to the above-described connecting pattern. The terminal plates 22 and connecting plate 23 are preferably made of the same material as that of the heating element 18, and are formed to have a plate-like shape with a predetermined cross-sectional area, in view of preventing fusion of the terminal plates 22 and the connecting plates 23 and restraining heat release therefrom.

In order to maintain the shape of the heat insulating member 16 and to reinforce the heat insulating member 16, as shown in FIG. 1, an outer circumferential surface of the heat insulating member 16 is preferably covered with an outer shell 28 made of metal such as stainless. Moreover, an outer circumferential surface of the outer shell 28 is covered with a water cooling jacket 30, so as to prevent leakage of heat from the heater 5 to the outside. A top part of the heat insulating member 16 is covered with an upper heat insulating member 31, and a stainless top plate 32 covering a top part (upper end part) of the outer shell 28 is disposed on an upper part of the upper heat insulating member 31.

In order that a temperature of the wafers is quickly lowered after a heat process so as to accelerate a process or to improve a throughput, the heater 5 is equipped with a heat discharging system 35 for discharging outward an atmosphere in a space 33 between the heater 5 and the processing vessel 3, and a forcible air-cooling unit 36 for forcibly cooling the processing vessel 3 by introducing an air of a normal temperature (20° C. to 30° C.) into the space 33. The heat discharging system 35 is mainly composed of an outlet 37 formed in an upper part of the heater 5, and a heat discharging pipe, not shown, for connecting the outlet 37 and a factory air-discharging system, not shown. The heat discharging pipe is provided with an air-discharging blower and a heat exchanger, not shown.

Figure 6:
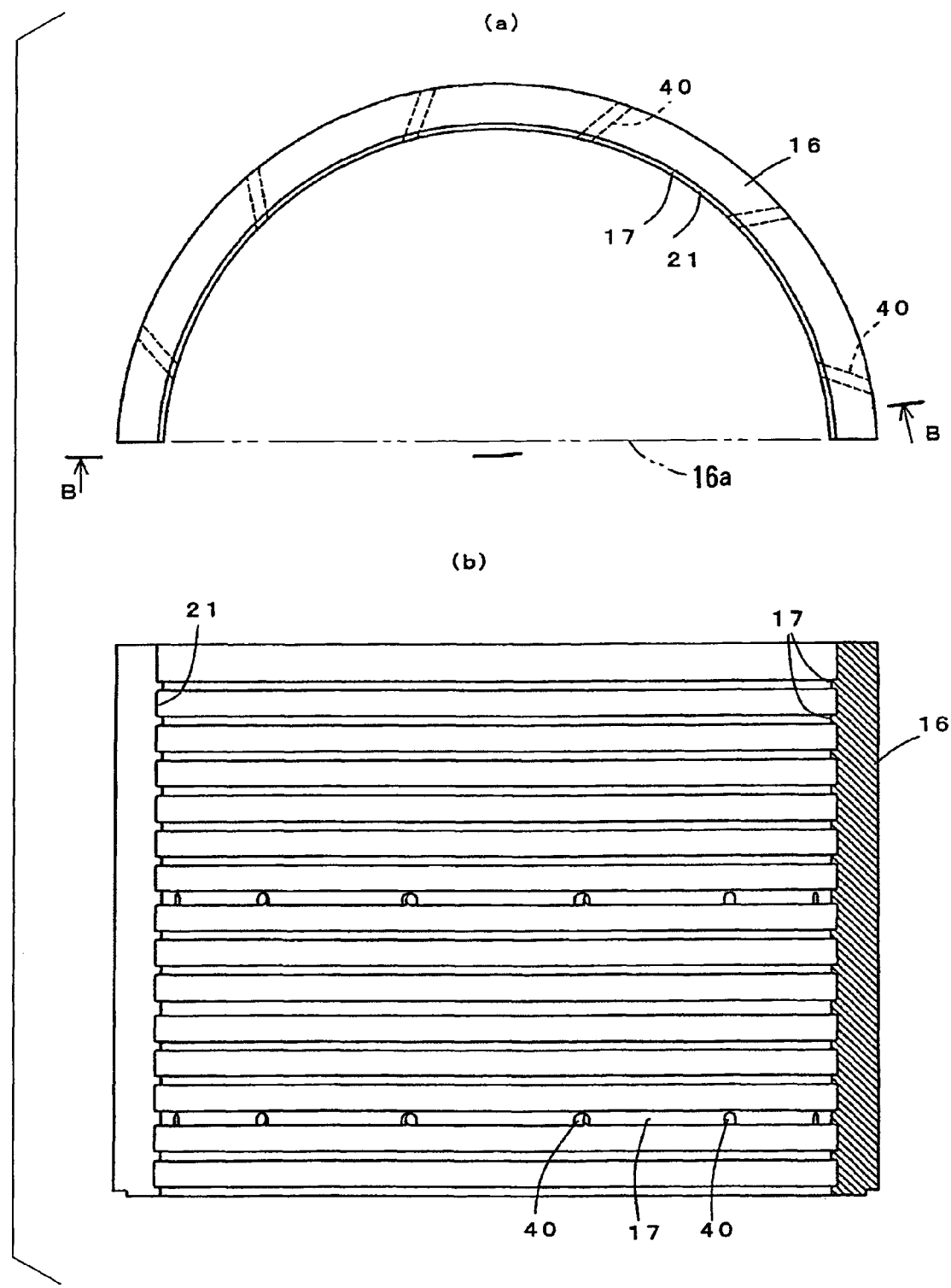
FIG. 6(a) is a plan view showing an example of a heat insulating member.
FIG. 6(b) is a cross-sectional view taken along a line B-B in FIG. 6(a)

The forcible air-cooling unit 36 has: a plurality of annular paths 38 that are formed between the heat insulating member 16 and the outer shell 28 in a height direction; and a plurality of forcible-cooling-air blowing holes 40 that are formed in the heat insulating member 16, through which air is blown from the respective annular paths 38 into the space 33 in an inclined direction with respect to the center of the heat insulating member 16 so as to generate whirls in the space 33 in a circumferential direction thereof. Each of the annular paths 38 may be formed by attaching a strip-shaped or annular heat insulating member 41 to the outer circumferential surface of the heat insulating member 16, or by annularly carving the outer circumferential surface of the heat insulating member 16. As shown in FIGS. 6(a) and 6(b), the air blowing holes 40 are preferably formed in the heat insulating member 16 so as to radially pass through from inside to outside the shelf section 17 which is disposed between the vertically adjacent heating elements 18. Since the air blowing holes 40 are formed in the shelf sections 17, air can be blown into the space 33 without interference of the heating elements 18.

A single common supply duct, not shown, for distributing a cooling fluid into the respective annular paths 38, is arranged on an outer circumferential surface of the outer shell 28 along a height direction thereof. The outer shell 28 is provided with communication holes that communicate the supply duct and the respective annular paths 38. To the supply duct, there is connected, via an on-off valve, a cooling-fluid supply source (e.g., ventilator), not shown, which sucks air in a clean room as a cooling fluid and pressure-feeds the same.

The heat processing furnace 2 or the vertical-type heat processing apparatus 1 as structured above includes: the processing vessel 3 for accommodating wafers w and performing thereto a heat process; and the cylindrical heater 5 disposed to surround the circumference of the processing vessel 3, for heating the wafers w. The heater 5 has the cylindrical heat insulating member 16, the groove-like shelf sections 17 formed in a tier-like manner axially on the inner circumferential surface of the heat insulating member 16, and the heating elements 18 placed along the respective shelf sections 17. The heating element 18 is manufactured by forming a strip-shaped heating element into a corrugated shape. The pin members 20 are arranged in the heat insulating member 16 at suitable intervals therebetween, the pin members 20 holding the heating elements 18 such that the heating elements 18 is movable in the radial direction of the heater 5, while preventing falling-out of the heating elements 18 from the shelf sections 17. Thus, the heating elements 18 of a corrugated type can be placed in an exposed manner on each shelf section 17 that are formed on the inner circumferential surface of the heat insulating member 16. Therefore, a temperature in the processing vessel 3 can be quickly increased and decreased, as well as improvement in durability and reduction in cost can be realized. With the use of the heating elements 18 of a corrugated type, a ratio of the element surface area can be effectively increased. Thus, a load, which may be caused by reduction in temperature of the heater surface, on the heating element can be relatively reduced to thereby restrain a breakage thereof. Therefore, a large power can be supplied to the heating elements 18 so as to quickly increase the temperature. Further, since disconnection can be restrained, improvement in durability, i.e., a longer lifetime can be attained. Furthermore, it is possible to use an inexpensive kanthal wire to form the heating element 18, and thus reduction in cost can be achieved.

The forcible-cooling-air blowing holes 40 are formed in the heat insulating member 16 so as to pass through from inside to outside the shelf section 17 which is disposed between the vertically adjacent heating elements 18. Thus, air can be easily blown therefrom without interference of the heating elements 18. The heat insulating member 16 is divided into two along the longitudinally extending dividing surfaces 16a, and each of the heating elements 18 is also divided corresponding to the heat insulating member. Thus, the heating elements can be easily assembled with the heat insulating member, i.e., assemblage thereof can be improved.

Figure 7:
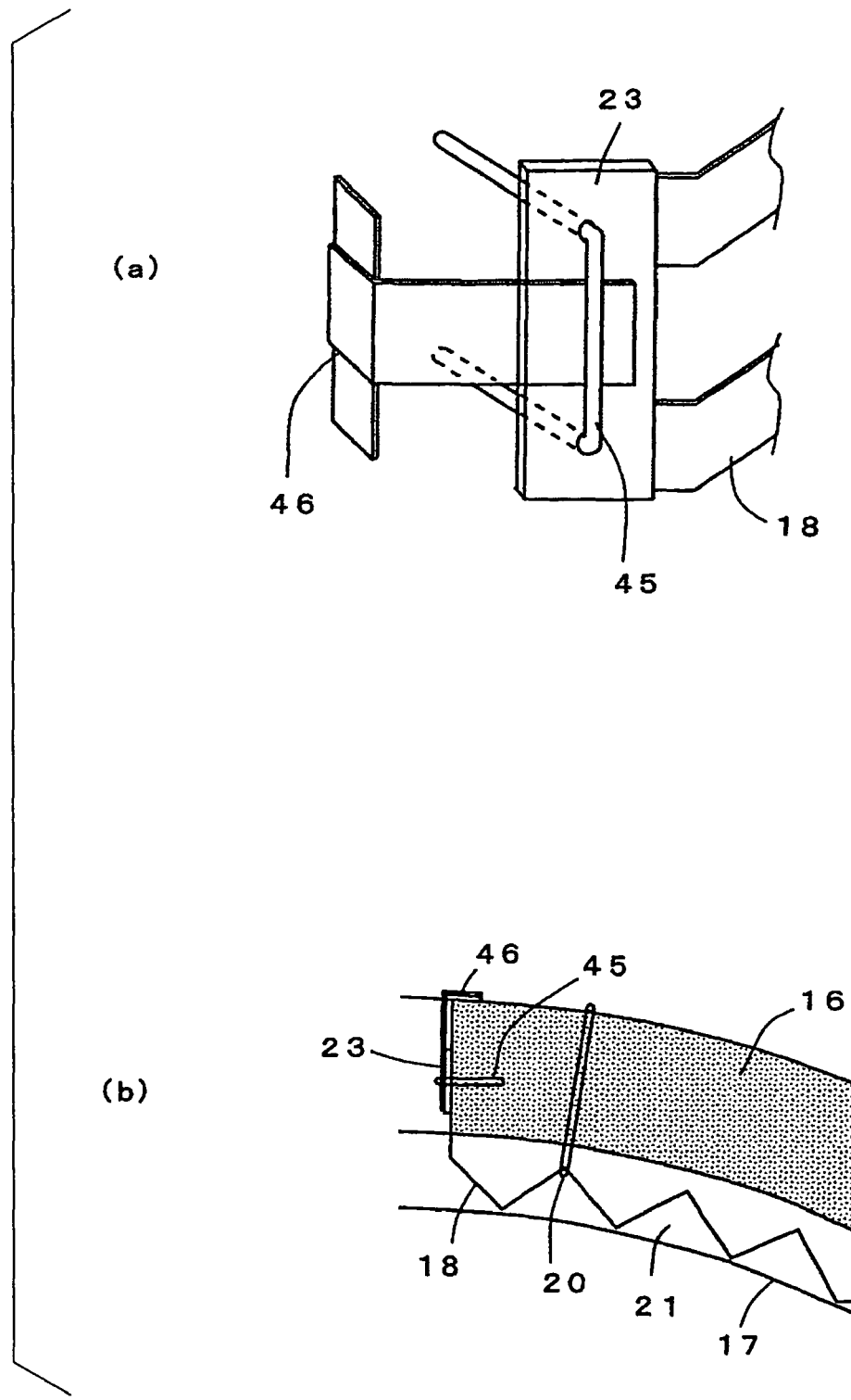
FIG. 7(a) is a main-part enlarged perspective view showing an example of a structure for fixing, to a heat insulating member, a connecting plate on an end of a heating resistor.
FIG. 7(b) is a sectional view of the fixed state.

FIG. 7 is a view showing an example of a structure for fixing, to the heat insulating member, the connecting plate on the end of the heating resistor. FIG. 7(a) is a main-part enlarged perspective view of the structure, and FIG. 7(b) is a sectional view of the fixed state. In order to restrain or prevent deformation of the connecting plate 23 at which the heating element 18 is bent (U-turned), the connecting plate 23 is fixed on the end (dividing surface) 16a of the heat insulating member 16 by means of a fixing member 45 such as a pin (a U-shaped pin is illustrated). In addition, the connecting plate 23 is equipped with a locking portion 46 to be locked on the outer circumferential surface of the heat insulating member 16.

Figure 8:
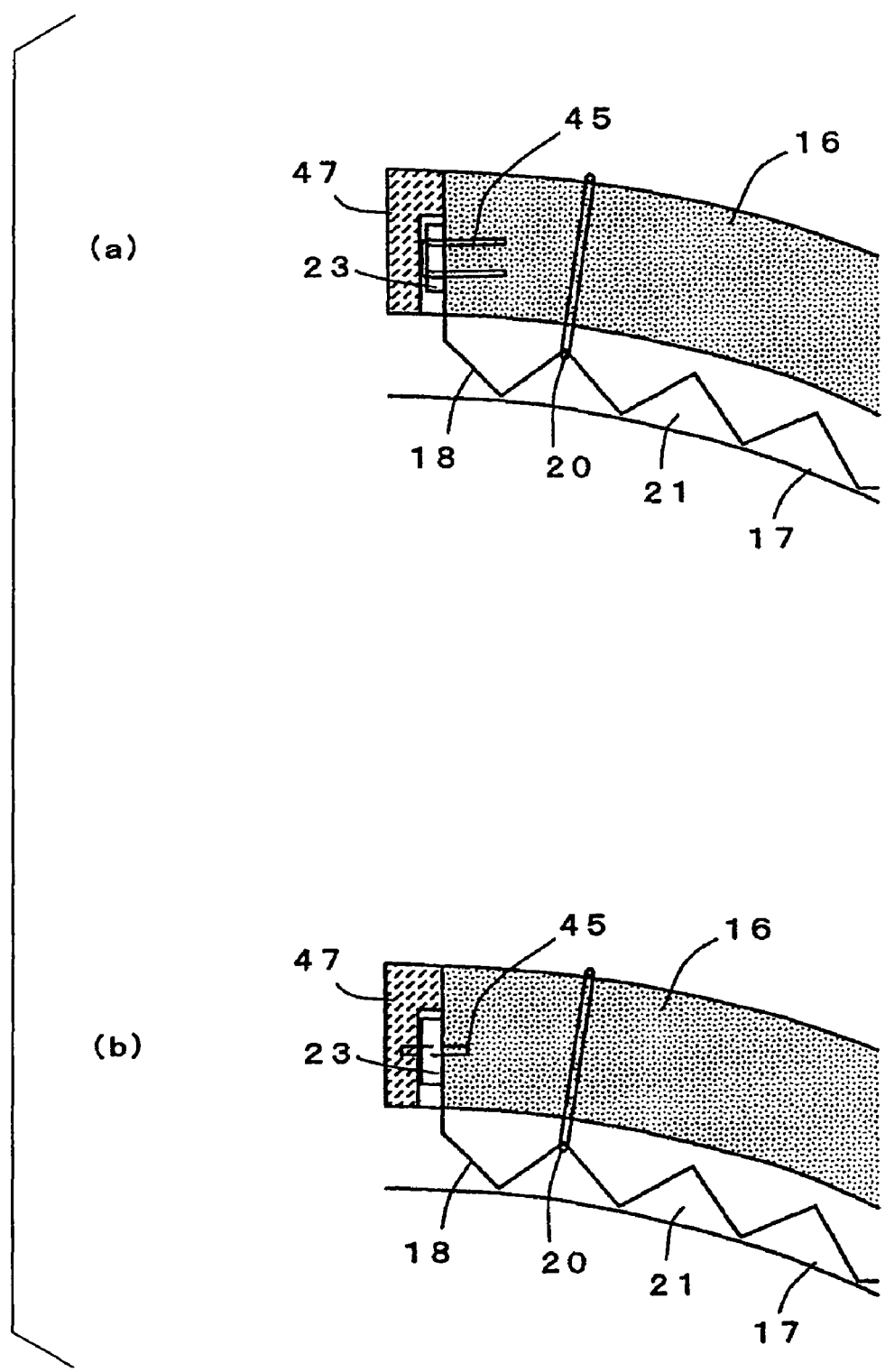
FIGS. 8(a) and 8(b) are sectional views showing another example of the structure for fixing, to the heat insulating member, the connecting plate on the end of the heating resistor.

FIGS. 8(a) and 8(b) are sectional views showing another example of the structure for fixing, to the heat insulating member, the connecting plate on the end of the heating resistor. The connecting plate 23 is fixed on the end of the heat insulating member 16 by means of the fixing member 45. In addition, an assisting heat insulating member 47 is disposed to cover the connecting plate 23. The assisting heat insulating member 47 is disposed in a space between the ends (dividing surfaces) of the heat insulating member 16, or filled into the space. Other than the pin, the fixing member 45 may be a pipe, a round bar, a square bar, and so on.

Figure 9:
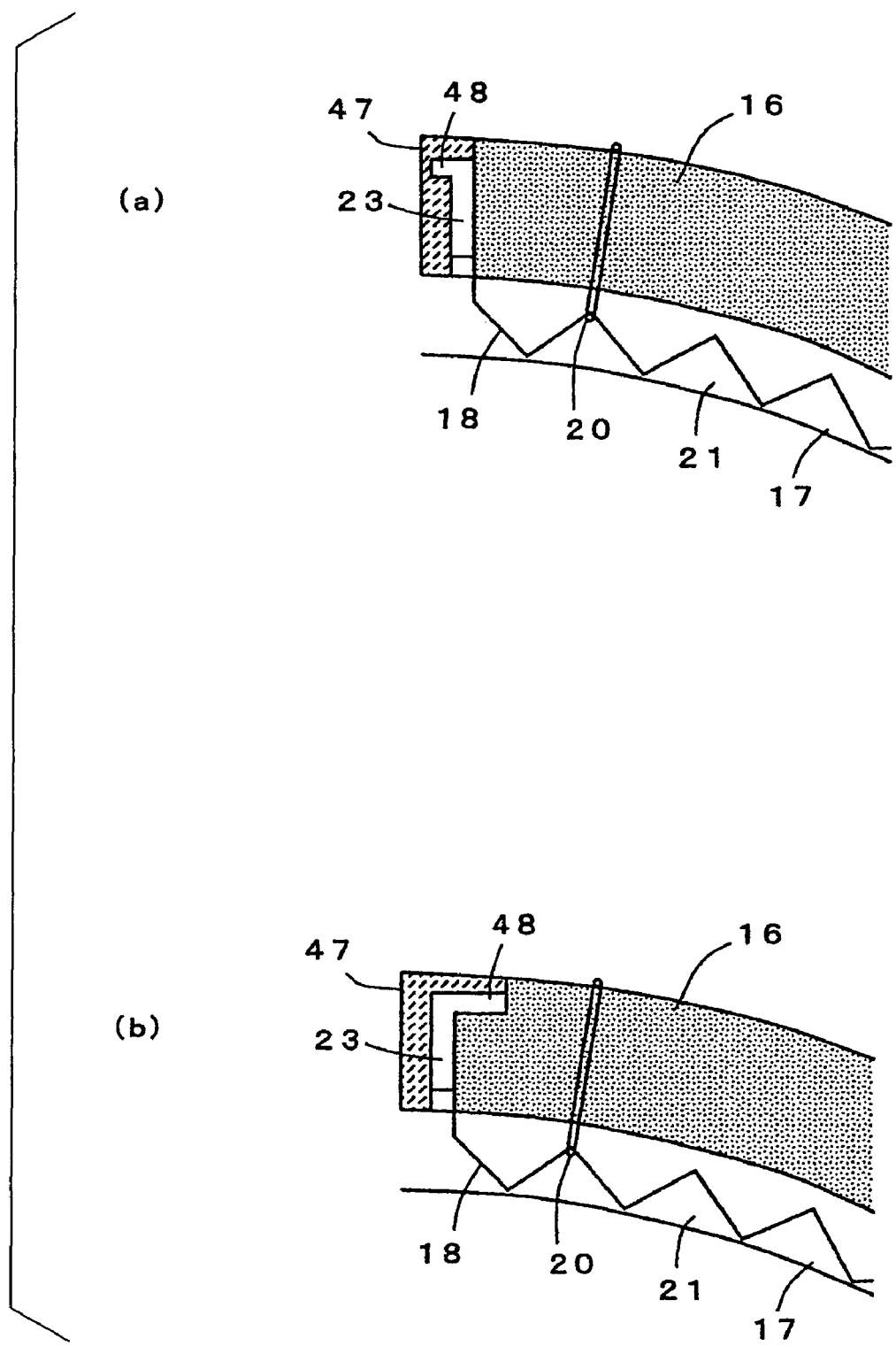
FIGS. 9(a) and 9(b) are sectional views each showing still another example of the structure for fixing, to the heat insulating member, the connecting plate on the end of the heating resistor.

FIGS. 9(a) and 9(b) are sectional view showing still another example of the structure for fixing, to the heat insulating member, the connecting plate on an end of the heating resistor. The connecting plate 23 is provided with a fixing piece 48 that is pushed into the heat insulating member 16 or the assisting heat insulating member 47 to be fixed therein. The fixing piece 48 is formed by bending a distal end of the connecting plate 23 at a right angle, for example. The assisting heat insulating member 47 is disposed on the end of the heat insulating member 16 so as to cover the connecting plate 23. The fixing piece 48 may be pushed into the assisting heat insulating member 47 (see, FIG. 9(a)). However, it is more preferable that the fixing piece 48 is pushed into the heat insulating member 16 (see, FIG. 9(b)).

Figure 10:
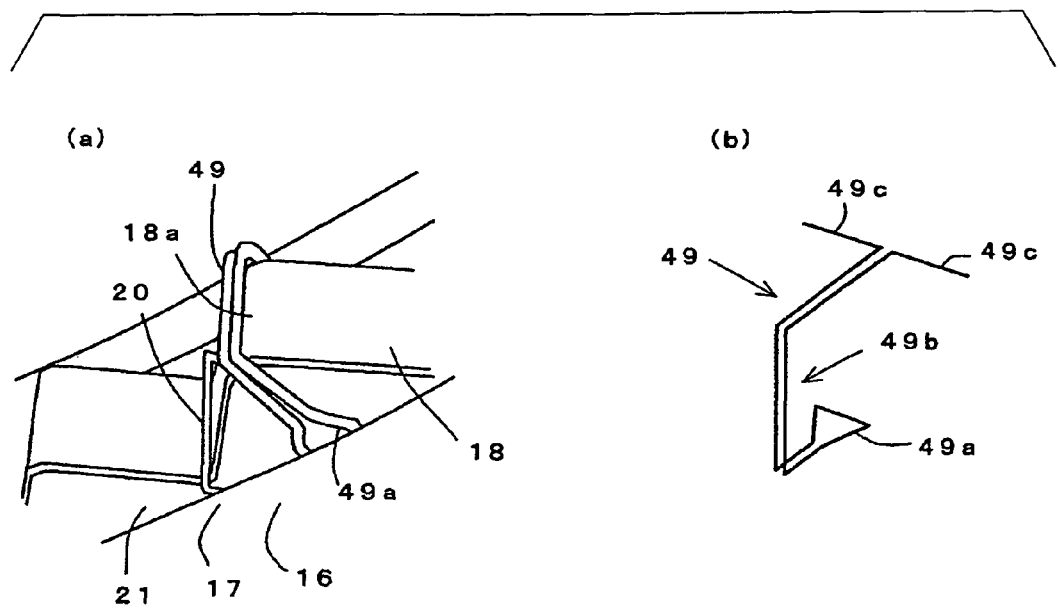
FIG. 10(a) is a partial perspective view showing a structure for holding a protruding portion of the heating resistor by a falling-down prevention pin.
FIG. 10(b) is a schematic perspective view of the falling-down prevention pin.

FIG. 10 is a view showing a structure for holding the protruding portion of the heating resistor by a falling-down prevention pin. FIG. 10(a) is a partial perspective view of the structure, and FIG. 10(b) is a schematic perspective view of the falling-down prevention pin. The heat insulating member 16 is equipped with a falling-down prevention pin 49 that holds the suitable protruding portion 18a of the heating element 18 corrugated inside the inner circumferential surface of the heat insulating member 16 so as to prevent falling-down thereof. The falling-down prevention pin 49 is formed by bending a wire rod such as a steel rod. One wire rod is bent into two, and the bent wire rod is further bent into a U-shape to provide a U-shaped portion. A distal bent portion is enlarged to form an enlarged portion 49a of a loop shape or a substantially triangular shape. The protruding portion 18a of the heating element 18 is received in the inside of the U-shaped portion 49b of the falling-down prevention pin 49, while the lower enlarged portion 49a is positioned near the heat insulating member 16, e.g., above the groove section 21 or the shelf section 17. Upper opposed end portions 49c and 49c of the falling-down prevention pin 49 penetrate the heat insulating member 16 to project from the outer circumferential surface thereof. By bending the opposed end portions 49c and 49c in right and left directions to form locking portions, the falling-down prevention pin 49 can be locked on the outer circumferential surface of the heat insulating member 16.

By the above attachment manner, the falling-down prevention pins 49 are disposed at suitable intervals therebetween in the circumferential direction of the heating elements 18 of the heat insulating member 16, and in a plurality of, e.g., three rows on the half part of the heat insulating member 16 in the axial direction thereof. Due to the falling-down prevention pins 49, falling-down and/or sagging of the heating elements 18 can be prevented, whereby a depth of the groove section 21 of the heat insulating member 16 or a projecting amount of the shelf section (appentice) 17 thereof can be reduced. Moreover, it is possible to eliminate the groove sections 21 and the shelf sections 17.

Figure 11:
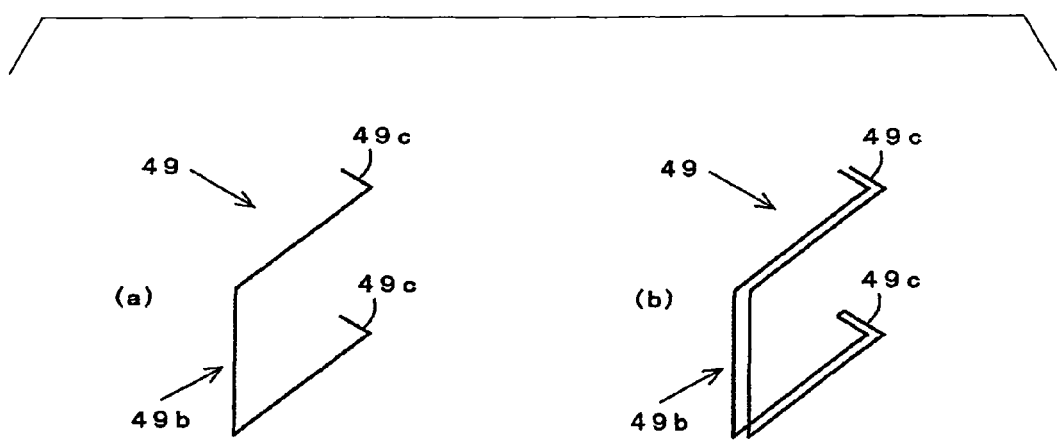
FIGS. 11(a) and 11(b) are perspective view each showing another example of the falling-down prevention pin.

FIG. 11 is a perspective view showing another example of the falling-down prevention pin. The falling-down prevention pin 49 may be formed by bending one wire rod into a U-shape (see, FIG. 11(a)), or by bending one wire rod into two and by bending the bent wire rod into a U-shape (see, FIG. 11(b)). Opposed end portions 49c and 49c are bent to form locking portions.

Figure 12:
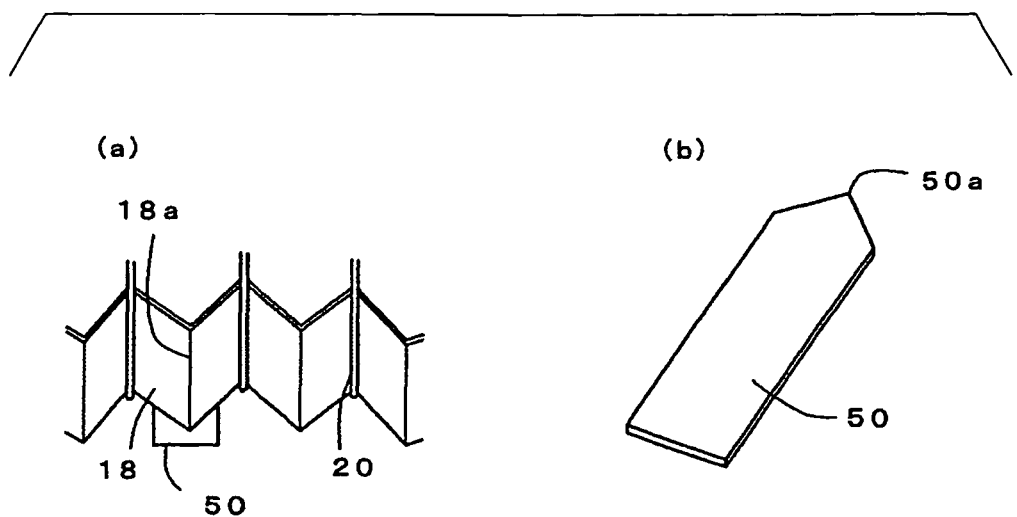
FIG. 12(a) is a partial perspective view showing a structure for holding the protruding portion of the heating resistor by a falling-down prevention plate.
FIG. 12(b) is a schematic perspective view of the falling-down prevention plate.

FIG. 12 is a view showing a structure for holding the protruding portion of the heating resistor by a falling-down prevention plate. FIG. 12(a) is a partial perspective view of the structure, and FIG. 12(b) is a schematic perspective view of the falling-down prevention plate. The heat insulating member 16 is equipped with a falling-down prevention plate 50 that supports a lower part of the suitable protruding portion 18a of the heating element 18 corrugated inside the inner circumferential surface of the heat insulating member 16 so as to prevent falling-down thereof. Preferably, the falling-down prevention plate 50 is made of a ceramic rectangular plate, and a pointed portion 50a, which can be thrust into the heat insulating member to be fixed therein, is formed on one longitudinal end of the falling-down prevention plate 50. Since the falling-down prevention plates horizontally support the lower parts of the protruding portions 18a of the heating elements 18, turnover and/or sagging of the heating elements 18 can be prevented. Thus, similar to the above embodiment, it is possible to eliminate the groove sections 21 and the shelf sections 17.

Figure 13:
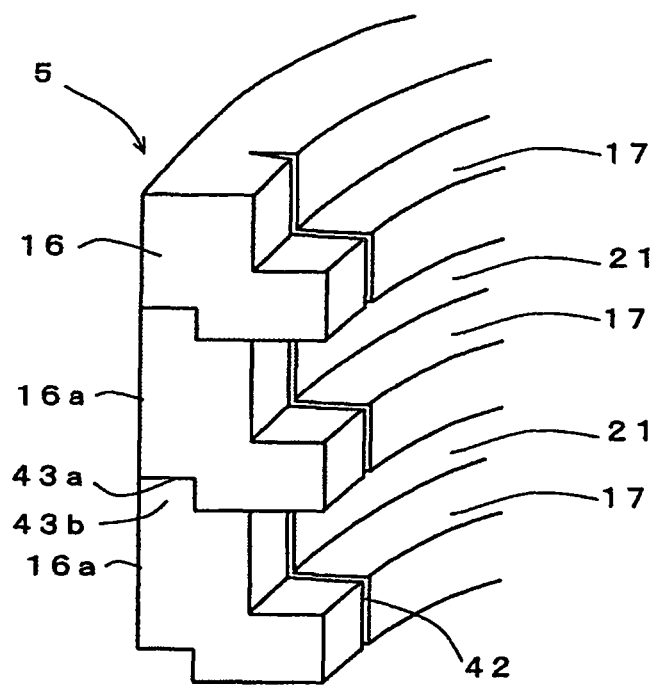
FIG. 13 is a partial perspective view showing another example of the heat insulating member.
Figure 14:
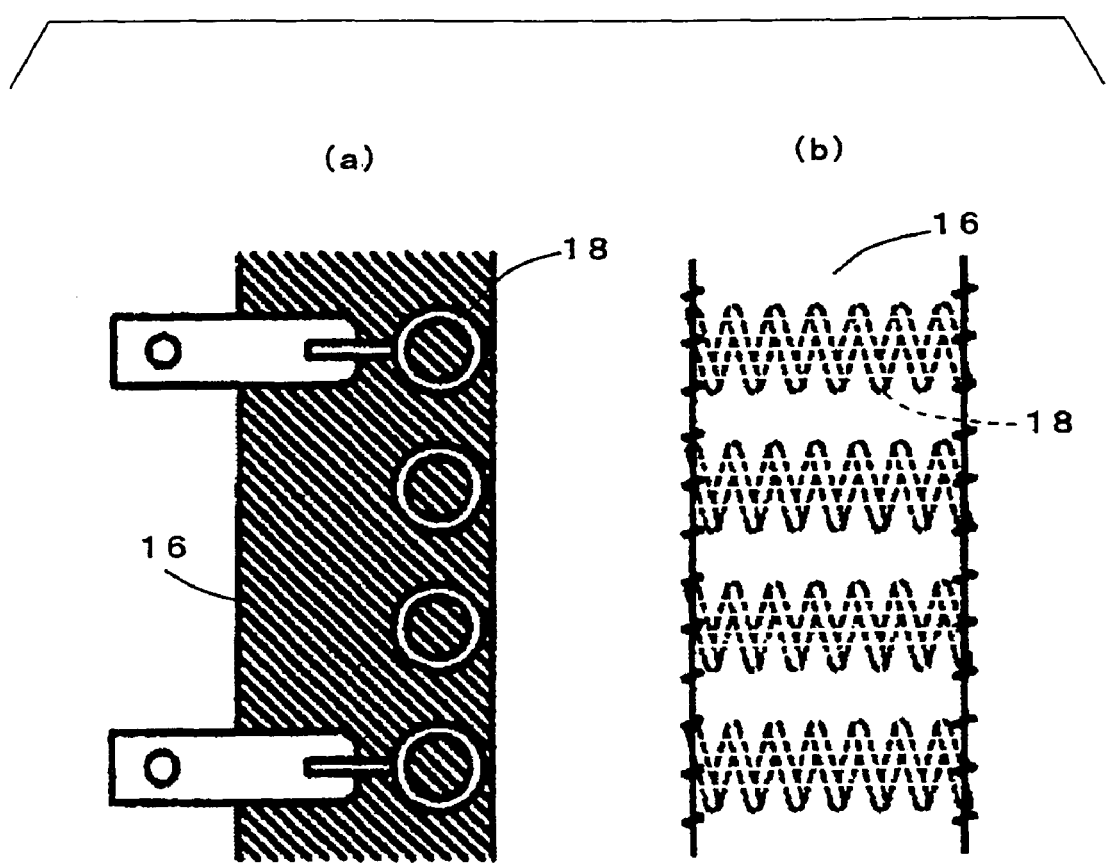
FIG. 14(a) is a cross-sectional view showing an example of a conventional heater.
FIG. 14(b) is a view of an inner circumferential surface of the heater.

FIG. 13 is a perspective view showing another example of the heat insulating member. There is a possibility that the inner circumferential surface of the heat insulating member 16 of the heater 5 sustains some cracks because of an internal stress caused by thermal expansion and thermal shrinkage. In order to avoid this cracking, as shown in FIG. 13, it is preferable that a slit 42 is axially formed in the inner circumferential surface. Further, for smoothly assembling the heater, the heat insulating member 16 is preferably, vertically divided at the lower surfaces of the respective shelf sections 17. Namely, it is preferable that the heat insulating member 16 is composed of a plurality of vertically divided blocks 16a. This structure facilitates placement of the heating elements 18 on the respective shelf sections 17. That is to say, a heating element 18 is firstly placed on the shelf section 17 of the first divided block 16a, the second divided block 16a is then laid thereon, and a heating element 18 is placed on the shelf section 17 of the second divided block 16a, and so forth. Thus, improvement in assemblage can be attained. In this case, it is preferable that a recess 43a and a protruding portion 43b, which can be engaged with each other for positioning, are circumferentially formed in opposed surfaces of the divided blocks 16a that are vertically adjacent to each other.

The embodiments of the present invention have been described in detail with reference to the drawings. However, the present invention is not limited to the above respective embodiments, and various modifications and changes are possible without departing from the scope of the present invention. For example, connected to a lower end of the processing vessel may be a cylindrical manifold made of a heat resistive metal, such as stainless steel, having an inlet pipe part and an outlet pipe part. In addition, the processing vessel may be of a dual tube structure.

The invention claimed is:

1. A heat processing furnace comprising:
    a processing vessel for accommodating an object to be processed and performing thereto a heat process; and
    a cylindrical heater disposed to surround an outer circumference of the processing vessel, for heating the object to be processed;
    wherein the heater includes a cylindrical heat insulating member, and heating resistors arranged along an inner circumferential surface of the heat insulating member,
    each of the heating resistors is formed of a strip-shaped member that is bent into a waveform having peak portions and trough portions, and
    pin members are arranged in the heat insulating member at suitable intervals therebetween, the pin members holding the heating resistor such that the heating resistor is movable in a radial direction of the heater, wherein
    the heat insulating member is divided into a right half part and a left half part, with longitudinally extending dividing surfaces therebetween,
    each of the heating resistors is also divided into a right half part and a left half part, corresponding to the heat insulating member,
    one heating resistor and the other heating resistors vertically adjacent thereto are connected to each other at their ends via connecting plates, and
    the connecting plates are disposed on the dividing surface parts of the heat insulating member.

2. The heat processing furnace according to claim 1, wherein
    each of the pin members is formed into a U-shape having a pair of leg portions for supporting the trough portion of the heating resistor,
    the respective leg portions pass through the heat insulating member from inside to outside, and
    the respective leg portions are bent on the outside to be locked on an outer circumferential surface of the heat insulating member.

3. The heat processing furnace according to claim 1, wherein
a plurality of circumferentially continuous groove sections are vertically formed at suitable intervals therebetween in the inner circumferential surface of the heat insulating member, and
all or a part of the heating resistors are received in the groove sections.

4. The heat processing furnace according to claim 1, wherein
a plurality of forcible-cooling-air blowing holes are circumferentially formed at suitable intervals therebetween in the heat insulating member to pass therethrough from inside to outside at a position between the vertically adjacent heating resistors.

5. The heat processing furnace according to claim 1, wherein
each of the connecting plates is fixed on the dividing surface part by means of a fixing member formed of a pin.

6. The heat processing furnace according to claim 1, wherein
each of the connecting plates is provided with a locking portion to be locked on an outer circumferential surface of the heat insulating member.

7. The heat processing furnace according to claim 1, wherein
each of the connecting plates is provided with a fixing piece that is pushed into the heat insulating member to be fixed therein.

8. The heat processing furnace according to claim 1, wherein
each of the connecting plates is provided with a falling-down prevention pin that holds the peak portion of the heating resistor.

9. The heat processing surface according to claim 1, wherein
the heat insulating member is provided with a falling-down prevention plate that supports a lower part of the peak portion of the heating resistor so as to prevent falling-down of thereof.

10. A vertical-type heat processing apparatus comprising
a heat processing furnace including: an elongated processing vessel for accommodating an object to be processed and performing thereto a heat process, with a lower end of the processing vessel being opened to define a furnace opening; and a cylindrical heater disposed to surround an outer circumference of the processing vessel, for heating the object to be processed;
a lid member for closing the furnace opening;
a holder placed on the lid member, the holder holding a plurality of objects to be processed in tier-like manner; and
an elevating mechanism that elevates and lowers the lid member to open and close the same, and loads and unloads the holder into and from the processing vessel;
wherein the heater includes a cylindrical heat insulating member, and heating resistors arranged along an inner circumferential surface of the heat insulating member,
each of the heating resistors is formed of a strip-shaped member that is bent into a waveform having peak portions and trough portions, and
pin members are arranged in the heat insulating member at suitable intervals therebetween, the pin members holding the heating resistor such that the heating resistor is movable in a radial direction of the heater, wherein
the heat insulating member is divided into a right half part and a left half part, with longitudinally extending dividing surfaces therebetween,
each of the heating resistors is also divided into a right half part and a left half part, corresponding to the heat insulating member,
one heating resistor and the other heating resistors vertically adjacent thereto are connected to each other at their ends via connecting plates, and
the connecting plates are disposed on the dividing surface parts of the heat insulating member.

11. The vertical-type heat processing apparatus according to claim 10, wherein
each of the pin members is formed into a U-shape having a pair of leg portions for supporting the trough portion of the heating resistor,
the respective leg portions pass through the heat insulating member from inside to outside, and
the respective leg portions are bent on the outside to be locked on an outer circumferential surface of the heat insulating member.

12. The vertical-type heat processing apparatus according to claim 10, wherein
a plurality of circumferentially continuous groove sections are vertically formed at suitable intervals therebetween in the inner circumferential surface of the heat insulating member, and
all or a part of the heating resistors are received in the groove sections.

13. The vertical-type heat processing apparatus according to claim 10, wherein
a plurality of forcible-cooling-air blowing holes are circumferentially formed at suitable intervals therebetween in the heat insulating member to pass therethrough from inside to outside at a position between the vertically adjacent heating resistors.

14. The vertical-type heat processing apparatus according to claim 10, wherein
each of the connecting plates is fixed on the dividing surface part by means of a fixing member formed of a pin.

15. The vertical-type heat processing apparatus according to claim 10, wherein
each of the connecting plates is provided with a locking portion to be locked on an outer circumferential surface of the heat insulating member.

16. The vertical-type heat processing apparatus according to claim 10, wherein
each of the connecting plates is provided with a fixing piece that is pushed into the heat insulating member to be fixed therein.

17. The vertical-type heat processing apparatus according to claim 10, wherein
each of the connecting plates is provided with a falling-down prevention pin that holds the peak portion of the heating resistor.

18. The vertical-type heat processing apparatus according to claim 10, wherein
the heat insulating member is provided with a falling-down prevention plate that supports a lower part of the peak portion of the heating resistor so as to prevent falling-down of thereof.

* * * * *